United States Patent
Farnworth et al.

(10) Patent No.: US 6,555,400 B2
(45) Date of Patent: *Apr. 29, 2003

(54) METHOD FOR SUBSTRATE MAPPING

(75) Inventors: Warren M. Farnworth, Nampa, ID (US); Derek J. Gochnour, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/934,620

(22) Filed: Aug. 22, 2001

(65) Prior Publication Data

US 2003/0038365 A1 Feb. 27, 2003

(51) Int. Cl.[7] .................. G01R 31/26; H01L 21/66; H01L 21/44; H01L 21/48; H01L 21/50
(52) U.S. Cl. .................... 438/17; 438/6; 438/10; 438/14; 438/15; 438/107; 438/110; 438/111; 438/112; 438/128; 438/129; 438/130; 438/460; 29/710; 186/64; 235/454; 235/464; 235/494
(58) Field of Search ............... 438/6, 10, 14, 438/15, 17, 107, 110–112, 128–130, 460; 29/710; 156/64; 235/454, 464, 494

(56) References Cited

U.S. PATENT DOCUMENTS

| | | |
|---|---|---|
| 4,426,341 A | 1/1984 | Tsuzuku et al. |
| 4,437,229 A | 3/1984 | Bitler et al. |
| 4,510,673 A | 4/1985 | Shils et al. |
| 4,554,126 A | 11/1985 | Sera |
| 4,585,931 A | 4/1986 | Duncan et al. |
| 4,787,143 A | 11/1988 | Yagi et al. |
| 5,172,053 A | 12/1992 | Itoyama |
| 5,175,425 A | 12/1992 | Spratte et al. |
| 5,181,097 A | 1/1993 | Ogata et al. |
| 5,197,650 A | 3/1993 | Monzen et al. |
| 5,256,578 A | 10/1993 | Corley et al. |
| 5,645,787 A | 7/1997 | Taruno et al. |
| 5,654,204 A | 8/1997 | Anderson |
| 5,872,398 A | 2/1999 | King et al. |
| 5,998,243 A | 12/1999 | Odashima et al. |
| 6,001,672 A | 12/1999 | Wensel |
| 6,021,380 A | 2/2000 | Fredriksen et al. |
| 6,052,798 A | 4/2000 | Jeddeloh |
| 6,090,644 A | 7/2000 | Moden |
| 6,106,259 A | 8/2000 | Lee et al. |
| 6,111,324 A | 8/2000 | Sheppard et al. |
| 6,117,382 A | 9/2000 | Thummel |
| 6,192,457 B1 | 2/2001 | Porterfield |
| 6,415,977 B1 * | 7/2002 | Rumsey ............... 235/454 |
| 2001/0004002 A1 * | 6/2001 | Arai et al. |

* cited by examiner

Primary Examiner—Albert W. Paladini
Assistant Examiner—David A. Zarneke
(74) Attorney, Agent, or Firm—TraskBritt

(57) ABSTRACT

A method and apparatus relating to fabricating semiconductor die packages including a mounting substrate and dice attached thereto. The mounting substrate includes multiple die attach sites and a designator having substrate identification information. The die attach sites are evaluated and categorized as either good or defective die attach sites, wherein the evaluated information is saved in an electronic file as mapped information. A die attach apparatus attaches dice to the die attach sites in accord with the mapped information, wherein known good dice are attached to the good die attach sites and known defective dice are attached to the defective die attach sites. The assembly is then encapsulated in a transfer molding operation. Since each die attach site includes a die attached thereto, the structural integrity of the mounting substrate is maintained and there is greater volume control of encapsulation material in the transfer molding operation to prevent waste and shortage of the encapsulation material. The assembly may then be segregated into individual semiconductor die packages, in which the defective die packages having the defective dice and defective die attach sites are discarded in accord with the mapped information.

12 Claims, 5 Drawing Sheets

METHOD FOR SUBSTRATE MAPPING

BACKGROUND OF THE INVENTION

1. Field of the Invention

This invention relates generally to mapping techniques for semiconductor substrates. More specifically, the present invention relates to methods and apparatus for identifying defective die sites and good die sites on semiconductor mounting substrates of any type and, if necessary, attaching defective dice to the defective die sites and, if necessary, attaching good dice to the good die sites.

2. State of the Art

In the fabrication of semiconductor packages, semiconductor dice (also known as "semiconductor devices" or "semiconductor chips") are typically mounted and electrically connected to carrier substrates appropriate for the chip type and the subsequent use of the package. For example, chip-on-board (COB), board-on-chip (BOC), ball grid array (BGA), chip-scale, or leads-over-chip (LOC) mounting arrangements may be made on printed circuit board strips, tape frames and other carrier substrates known in the art. After die attach (the mounting of the semiconductor die to the carrier substrate), the hybrid combination of components is electrically connected, generally through wire bonding, conductive adhesives or solder reflow and encapsulated for protection. The finished package is then made available for use in a wide variety of applications.

Semiconductor dice and carrier substrates are distinct components which are manufactured by separate processes. Individual integrated circuit dice are usually formed from a larger structure known as a semiconductor wafer, which is typically comprised primarily of silicon, although other materials such as gallium arsenide and indium phosphide are also sometimes used. Each semiconductor wafer has a plurality of integrated circuit semiconductor dice and/or circuitry, arranged in rows and columns with the periphery of each integrated circuit being substantially rectangular in shape, the integrated circuits of the semiconductor die being formed through a combination of deposition, etching, and photo-lithographic techniques. The inactive silicon backsides of the wafers are typically thinned (i.e., have their cross sections reduced) by a mechanical and/or chemical grinding process, and the wafers sawed or "diced" into substantially rectangularly shaped discrete integrated circuit semiconductor dice. The nature and complexity of the process for fabricating integrated circuits make the manufacturing cost of an individual semiconductor die relatively high.

With respect to the various carrier substrates for COB, BOC, BGA, LOC, chip-scale, and other types of packages, each of the carrier substrates is generally manufactured with several common features: an attachment site for at least one semiconductor die, a plurality of bond pads and conductive traces for interconnecting conductors on one or more semiconductor dice, a resist or insulating layer for electrically isolating the conductive traces and interconnections, tooling holes on the substrate edges for automated machine handling, and alignment marks for semiconductor die placement, wire bonding, and substrate orientation. The electronic properties and performance of the carrier substrate are determined by precise characteristics of the conductive layers and insulation layers which form it, including the composition, thickness, and surface quality of the various types of layers.

Currently, many carrier substrates (also referred to as "mounting substrates") have multiple die attach sites per carrier substrate, which may further be formed in an array arrangement of several across or a matrix of columns and rows. Such high-density arrays or matrices are suitable for increased throughput in automated processing, such as die attach processing, as well as desirable for use in various electronics applications. The array or matrix of die attach sites of any given substrate may range, for example, from a 2×3 matrix (2 columns×3 rows) to a 20×20 matrix. Typically, a 2×3 matrix for a BGA-type carrier substrate 10 is depicted in drawing FIG. 1. Semiconductor die sites 20, for mounting and electrical attachment of a semiconductor die to each site 20, are configured in an arrangement of two columns and three rows. Pin one indicators 22 and fiducial marks 24, which provide orientation for vision systems associated with automated machine handling and semiconductor die placement apparatus (not shown), are formed as openings in a layer of solder resist 26 on carrier substrate 10. Semiconductor die sites 20 are shown with solder balls 32 of the BGA surrounding each semiconductor die receiving area 50 with solder balls 32 configured in a ball grid array arrangement 54. The solder balls 32 are typically placed on contact pads (not shown), which are further electrically interconnected to circuit traces (not shown) underlying a passivation layer of solder resist 26 on the surface of the carrier substrate 10. The circuit traces are, in turn, electrically connected to other contact pads within or immediately proximate semiconductor die sites 20.

After die attach, conductive wires extending from the active surface of the mounted semiconductor die are typically wire bonded onto the contact pads in the semiconductor die site 20 of the carrier substrate 10. The conductive traces, contact pads, and other contact pads are typically formed by laminating or depositing a metal material (e.g., copper) onto a base insulating substrate material. Subsequent photo-lithographic and etching techniques are then used to define the actual conductive patterns.

Referring again to drawing FIG. 1, carrier substrate 10 also includes a layer of solder resist 26. The layer of solder resist 26 is applied using photo-lithographic processes onto carrier substrate 10, and serves to mask or shield conductive members on the top and bottom carrier substrate surfaces during subsequent soldering and/or plating processes and/or various other processes. Various solder resist materials are well known and commercially available for such processes. With respect to the surface of carrier substrate 10, solder resist layer 26 may mask all portions of the surface except the semiconductor die sites 20 and the contact pads for placement of solder balls 32. As previously described, pin one indicator 22 and fiducial marks 24 are typically formed as openings in solder resist layer 26 subsequent to the deposition thereof. Any conductive elements within semiconductor die site 20 thus remain exposed, as does at least a portion of the contact pads, after application of solder resist layer 26 to the top surface of the carrier substrate 10.

In the process of die attach, a die attach apparatus typically uses a vision system to locate a fiducial mark 24, pin one indicator 22, and/or any other alignment feature on the lead frame or other mounting substrate. Using an X-Y table for proper alignment, the vision system checks the semiconductor die position on the die pickup tool and directs the apparatus to adjust the substrate and die pickup tool into the correct positions for precise semiconductor die placement. Typically, semiconductor dice are presented to a die attach apparatus in sawed wafer form and are mounted on wafer tape for attachment on metal lead frames or any suitable substrate. For some die attach apparatus, semiconductor dice may also be presented in gel or waffle pack form for attachment to the desired substrate. In the die bonding process, semiconductor dice are selectively picked from those of wafers respectively probe-tested in their manufacturing factories using various testing equipment. To orient the semiconductor dice, the die bonder's vision system identifies a feature on a die and directs the X-Y table to pick up and align the die in the X, Y, and theta directions. Meanwhile, a mounting substrate has been indexed to the die attach site and properly oriented. At the die attach site, a precise amount of adhesive, such as epoxy resin, is applied. The picked-up die is then bonded to the die attach site of the mounting substrate via the adhesive.

Since semiconductor dice are high-grade products with highly integrated structures, the cost per semiconductor die is relatively high. As such, prior art die attach processes tend to focus on methods of dealing with defective semiconductor dice and not defective die sites on a mounting substrate.

In each batch of manufactured semiconductor dice and substrate components, a small percentage of the substrate components will be defective. In an effort to minimize the costs and maximize the quality of assembled packages, steps are typically taken to ensure that only semiconductor dice and substrate components which are found to be functional are assembled with one another. Therefore, prior to the die attachment process, wafers, semiconductor dice and carrier substrates are typically tested for electrical defects, contamination, and other irregularities. Semiconductor dice and substrates that are found to be defective are typically marked in a manner so as to distinguish them from known good components.

There are numerous teachings relating to the marking and/or mapping of defects in semiconductor wafers and semiconductor dice. One method for marking used extensively in the semiconductor industry is to use colored ink dots to label semiconductor dice which have failed testing procedures. These ink dots can be read by a vision system for automated pick-and-place processing. For example, U.S. Pat. No. 5,654,204 to Anderson discloses a process in which a wafer is electronically mapped, individual semiconductor dice are tested, and a wafer map identifying the defective semiconductor dice is produced and provided to an automated inking apparatus.

In U.S. Pat. No. 5,256,578 to Corley et al., a method for wafer map recording is disclosed wherein individual active dice are tested for functionality while in wafer form. The active dice are then categorized based on functional results, and the testing results are summarized on a wafer map. A binary code is then generated which contains the entire wafer map information. This information is recorded on the semiconductor wafer by laser scribing, and the results used for either manual or automated die selection.

In U.S. Pat. No. 6,021,380 to Fredriksen et al., a scanner is employed to produce a virtual image of the wafer, identifying all chips even when diced apart. A vision system uses the virtual wafer image to sort out defective chips, and gross defects identified by the vision system process are classified and marked in a computer-stored wafer map.

Various patents, such as U.S. Pat. No. 5,175,425 to Spratte et al., U.S. Pat. No. 4,585,931 to Duncan et al., and U.S. Pat. No. 4,510,673 to Shils et al., are directed to assorted other semiconductor marking techniques. The patents to Spratte et al. and Duncan et al. disclose processes for laser marking and identifying semiconductor wafers with a machine readable bar code, while the patent to Shils et al. discloses a method of laser marking the backside of individual dice with a unique identifying code.

The prior art of identifying and marking defective carrier substrates is less expansive than the art dealing with defective semiconductor wafers or dice. When irregularities are found on individual die sites of a carrier substrate strip, the entire strip is ordinarily not rendered unusable unless a substantial number of the die sites are found to be defective. For some strips, defective sites constituting 10% or greater of the total number of die sites will justify discarding the entire strip. In other strip arrays, higher numbers of defective die sites are tolerated. When a defective die site is identified on a substrate, typically by automated testing apparatus or a vision system, conventional practice is for an operator to manually "x-out" or "ink-out" a feature of the defective die site, rendering the feature "unreadable" by the vision recognition system of an automatic die bonding apparatus. A relatively simple system of vision recognition is a black and white digital recognition system (DRS), which can recognize inked-out features and streets between die attach sites. In more sophisticated operations, a pattern recognition system (PRS) is used as a vision system to identify defects and to recognize inked-out features. The PRS can also be used to align a bond pad with a die.

The "inking out" is usually accomplished by marking over an exposed feature in the solder resist which is a component of the defective die site, completing the mark with an ink pen, for example. As used herein, the term "exposed feature" denotes an opening in the solder resist which typically exposes a visibly discernible Au/Ni/Cu surface. Features which are commonly "inked out" include pin one indicators, bond pads, and/or fiduciary marks, as shown, for example, in drawing FIG. 1, illustrating inked-out marks 34 over pin one indicators 22, where the semiconductor die sites 20 have been found defective. Accordingly, during the die attach process, defective semiconductor die sites 20 do not receive dice attached thereto and the good die semiconductor sites 20 do receive dice 50 attached thereto.

It is also the case, however, that automated processes for the marking of defective substrates have been known in the art. U.S. Pat. No. 4,437,229 to Bitler et al. discloses a method of marking defective electronic articles in an array arrangement. The method entails forming film circuit articles in the array with added test pads and resistive elements and electrically altering a resistive element to a relatively high resistive value when a defective circuit is found. The article substrate (an array of film circuits) is subsequently fed into a holding apparatus which measures the resistive value of the resistive element, thereby labeling the substrate as acceptable or defective. The holder then transfers this data to a microprocessor within a die bonding apparatus. The die bonder then directs chips to be bonded only to those array circuits which have been labeled as functional by virtue of their low resistive values. As such, array circuits with any defective elements therein are discarded, even though many of the circuits in the array may be acceptable.

U.S. Pat. No. 4,787,143 to Yagi et al. discloses a method for applying a code mark to a substrate to which electronic parts are to be mounted. The code mark, which may be a bar code, is formed on the substrate prior to the mounting of a semiconductor die. Once the semiconductor die is mounted on the substrate, a mounting failure detection mechanism on a die mounting apparatus serves to automatically detect an incorrect or defective mounting of the die. The mounting failure detection system is further configured with a code reader for reading the code mark of each substrate and a control box for generating mounting failure data. Yagi et al.

teaches that when a mounting failure has been detected, a mounting failure data edit controller collates mounting failure data supplied from the control box with the code signals from the code reader, then uses the data to classify and automatically separate defective substrates from good ones. Although Yagi et al. eliminates defective substrates, Yagi et al. only determines such defects after the dice are mounted on the substrate; thus, such defects are discovered irrespective of the dice or the substrate alone, potentially resulting in the loss of good dice mounted to already defective die attach sites.

U.S. Pat. No. 5,197,650 to Monzen et al. teaches placing an identifier, preferably a bar code, on a lead frame prior to the mounting of semiconductor dice thereon. Semiconductor dice are first tested, then mounted to the lead frame. As the dice are mounted, an information processing unit adds information about the lead frame to the semiconductor die test results. The accumulated data is then forwarded to the next phase of the packaging process, which may be wire bonding, for example. The wire bonding apparatus receives the combined data and uses it accordingly to perform wire bonding operations. Monzen et al., however, does not teach that the bar code contains information about defective semiconductor die sites. Instead, Monzen et al. teaches that as the dice are mounted to the lead frame, the identifying information on the bar-coded lead frame is combined with the semiconductor die test results to be employed at later stages after semiconductor die bonding.

As can be seen from the foregoing, the prior art automated processes dealing with defective carrier substrates sacrifice good semiconductor dice to be attached to defective die sites, in which such good dice are discarded. With respect to the method of manually inking-out a defective semiconductor die site, it is troublesome and inefficient. Furthermore, when a carrier substrate with one or more inked-out die sites is placed in an automated die attach apparatus, data from the digital or pattern recognition system and/or testing systems is fed into a processor. The processor interpreting the data instructs the die attach apparatus to skip over the defective die sites. As a result, the carrier substrate may include several unoccupied die attach sites (die attach sites without semiconductor dice attached thereto), as shown in drawing FIG. 1.

However, unoccupied die attach sites present several problems, namely problems relating to the structural integrity of the carrier substrate and the finished semiconductor package. With respect to structural integrity, the carrier substrates are designed and formed with the intention of carrying a semiconductor die attached to each of the multiple die attach sites on the carrier substrate. Such attachment of the semiconductor dice provides strength to the carrier substrate in order to handle the processes associated with fabricating the semiconductor package. Without each of the die attach sites having a die attached thereto, the structural integrity and mechanical reliability of the carrier substrate is compromised. This problem is only exacerbated with the ongoing advances of semiconductor technology, resulting in the miniaturization of semiconductor components, which includes carrier substrates having thinner size specifications.

Furthermore, another problem associated with carrier substrates not having a die attached to each of the die attach sites involves encapsulating the carrier substrates via a transfer molding operation. In particular, encapsulant volume requirements for filling mold cavities is varied due to unoccupied die attach sites on the carrier substrate. Such variable volume requirements either result in waste which is costly and inefficient use of the encapsulation material or result in a shortage of encapsulation material which produces defective packages.

To illustrate a transfer molding operation, drawing FIGS. 2A and 2B show premolding and postmolding positions using a typical mold apparatus comprising upper and lower mold halves 110 and 112, each mold half including a platen 114 or 116 with its associated chase 118 or 120. Heating elements 122 are employed in the platens to maintain an elevated and relatively uniform temperature in the runners and mold cavities during the molding operation. FIG. 3 shows a top view of one side of the transfer mold apparatus of drawing FIGS. 2A and 2B illustrating the above-noted problem of having a shortage of encapsulation material. In the transfer mold apparatus shown, the encapsulant flows into each mold cavity 144 through the short end thereof.

In operation, a heated pellet of resin mold compound 130 is disposed beneath ram or plunger 132 in pot 134. The plunger descends, melting the pellet and forcing the melted encapsulant down through sprue 136 and into primary runner 138, from which it travels to transversely oriented secondary runners 140 and across gates 142 into and through the mold cavities 144 through the short side thereof flowing across the carrier substrate 10, wherein carrier substrate 10 comprises dice 50 attached thereto, such as an array of six dice attached to a carrier substrate for positioning in and across six mold cavities 144 shown in drawing FIG. 3. Air in the runners 138 and 140 and mold cavities 144 is vented to the atmosphere through vents 146 and 148. With this arrangement, since the pellets of resin are substantially consistent in size, the melted pellets or encapsulation material thereby includes a substantially consistent volume, resulting in the shortage of encapsulation material for the transfer molding operation when having unoccupied die attach sites. Such encapsulation shortage as illustrated in drawing FIG. 3 results in defective packaging of dice.

Accordingly, what is needed in the art is a method and apparatus of maintaining the structural integrity of the carrier substrate and preventing defects in the encapsulant mold and the waste thereof that are automated, accurate, low cost, relatively simple, and include high throughput.

SUMMARY OF THE INVENTION

The present invention relates to a method and apparatus which maintain the structural integrity of a mounting substrate and provide volume control of encapsulation material in a transfer molding operation. The present invention includes a method and apparatus for preventing defects in semiconductor packaging which are automated, accurate, low in cost, maintain relative simplicity, and provide increased throughput and yield.

The present invention includes a mounting substrate assembly having a substrate with a plurality of semiconductor die sites, each of the semiconductor die sites being pretested and categorized as either a good die site or a defective die site. The mounting substrate assembly may include any chip and board type substrate or any type lead frame type assembly, either having one or more semiconductor die mounted thereon in any fashion having any type of connection with the substrate. The mounting substrate assembly includes a plurality of semiconductor dice attached to the semiconductor die sites. Each of the dice are pretested and categorized as either a good semiconductor die or a defective semiconductor die so that each good semiconductor die is attached to a good die site and each defective die is attached to a defective die site. Each of the semiconductor dice on the mounting substrate assembly is then encapsulated with an encapsulation mold in a transfer molding operation, after which, the mounting substrate assembly is segregated into individual semiconductor die packages, wherein the packages are separated between the categorized good dice attached to the good die sites and defective dice attached to the defective die sites.

An aspect of the present invention includes a designator having encoded information thereon, which is included on the mounting substrate assembly. The designator may be provided on an unused peripheral portion of the substrate, which is separate from the locale of the die sites thereon. The encoded information preferably comprises information in the form of a bar code, or a series of identifying marks. The designator may also comprise a strip of magnetic tape with information programmed thereon. The encoded information includes substrate identification information which corresponds with and allows access to an electronic file in a database at a remote location.

The electronic file includes identification information and mapped information of the substrate, such as the locale of each die site, functionality of each die site (i.e., defective, good), manufacturing information, testing specifications and parameters, lot number, and time, date and place of manufacture, etc. The electronic file may also include wafer mapped information with respect to defective dice and good dice of a particular wafer. The electronic file is provided and updated with the mapped information prior to and/or after testing the substrate and determining precise locations of each of the defective die sites and the good die sites. Accordingly, the mapped information is used for locating each of the good die sites and the defective die sites for attaching respective good dice and defective dice thereto.

In another aspect of the present invention, there is a system for fabricating semiconductor packages at various semiconductor packaging stations which may be coupled to and update the mapped information in the electronic file. Such semiconductor packaging stations include a substrate testing station, a die attach station, a molding station and a segregation station.

At the substrate testing station, a mounting substrate having a plurality of die sites is provided for testing. The testing may include both mechanical and electrical testing of the mounting substrate and the plurality of die sites thereon. The test results for each mounting substrate are electronically recorded and uploaded to the electronic file as mapped information, which includes information as to the precise locale of each die site and which die sites are good and which are defective. The designator, which identifies the particular mounting substrate, may be placed on a peripheral portion of the substrate. The designator may be provided on the substrate while at the substrate testing station or prior thereto.

The mounting substrate is then moved to the die attach station, which includes a reading unit and pick and place equipment having access to good dice and defective dice. A particular mounting substrate is identified by the reading unit, which reads the designator. Such reading unit is configured to access the mapped information from the electronic file for the particular mounting substrate. In accord with the mapped information, the pick-and-place equipment can locate each die attach site and designate each die site as good or defective. Thus, the pick-and-place equipment can then attach known good dice to the known good die sites and known defective dice to the known defective die sites. The mapped information in the electronic file may be updated with information with respect to the die attach process at the die attach station.

The mounting substrate is then transported to the molding station. The molding station includes a transfer molding assembly having a transfer mold and cavities therein for encapsulating the die on the mounting substrate. According to an aspect of the present invention, the amount of encapsulation material required for filling the cavities is known and consistent since each of the die sites is occupied with a die attached thereto. In this manner, defective molding due to a shortage of encapsulation material is prevented. The waste of encapsulation material is also prevented.

The mounting substrate having a plurality of semiconductor die packages is then transported to a segregation station. A reading unit at the segregation station scans the designator on the mounting substrate, thereby providing mapped information from the electronic file as to which semiconductor die packages, comprised of dice attached to die sites, are good and which are defective. In accord with the mapped information, the segregation station singulates the mounting substrate into individual semiconductor die packages via a segregation unit and separates the defective die packages from the good die packages. The defective die packages are discarded and the good die packages proceed for further testing and/or processing.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

The method and apparatus of the present invention will be more fully understood from the detailed description of the invention taken in conjunction with the drawings, wherein.

DETAILED DESCRIPTION OF THE INVENTION

Figure 1:
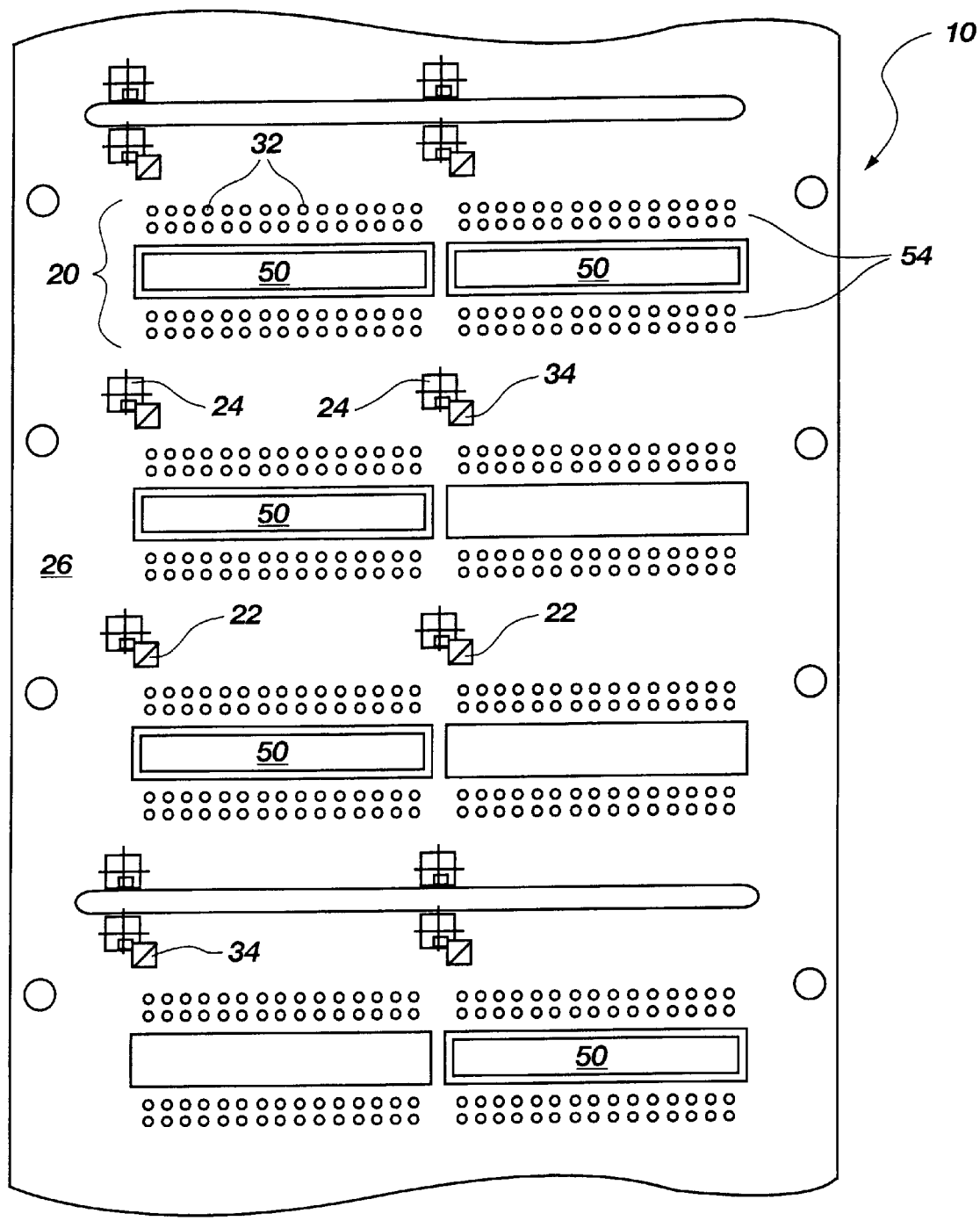
FIG. 1 illustrates a top view of a conventional BGA-type carrier substrate having multiple semiconductor die sites with semiconductor dice mounted thereto.
Figure 2A:
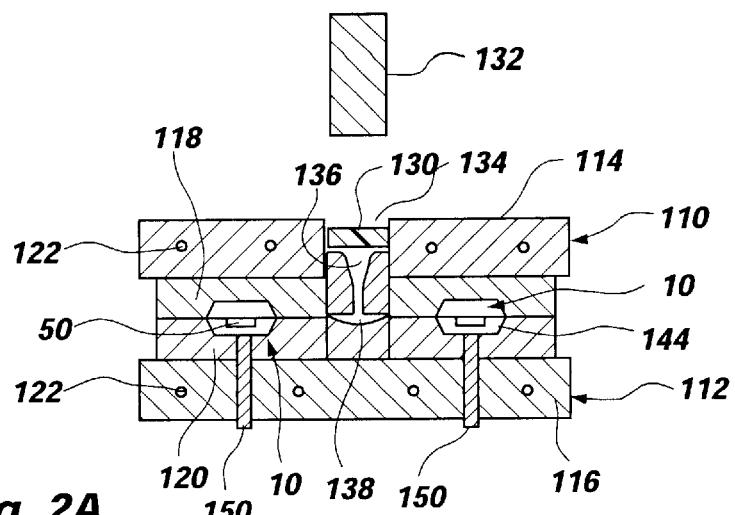
FIGS. 2A and 2B illustrate side schematic views of one side of a typical transfer molding operation, showing premolding and postmolding encapsulant positions.
Figure 2B:
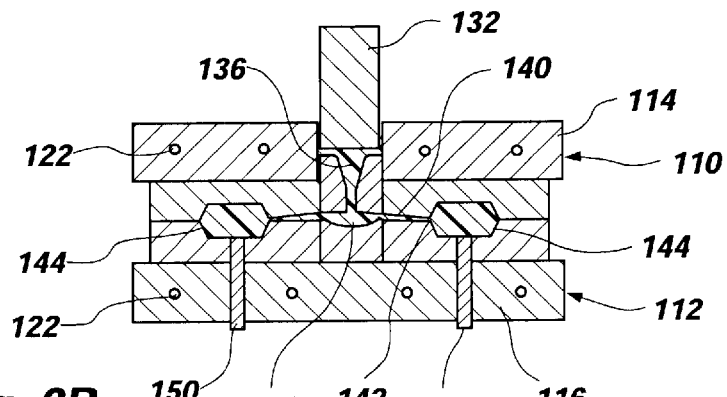
Figure 3:
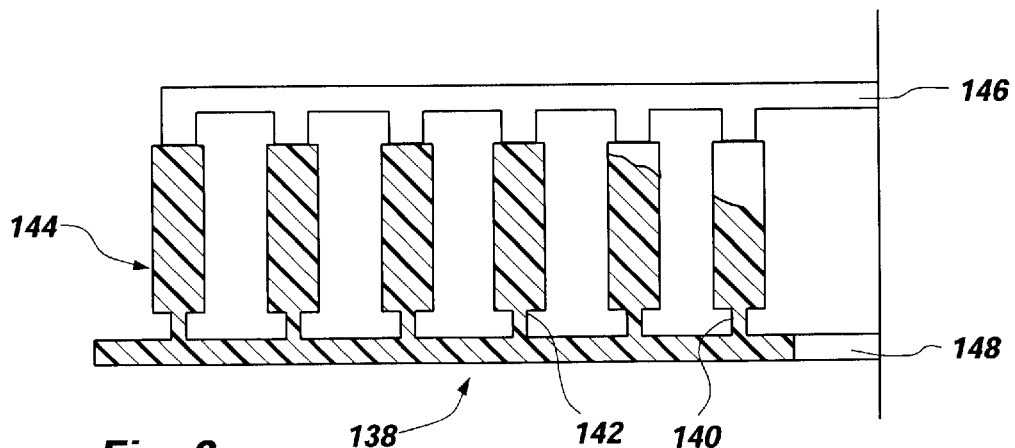
FIG. 3 illustrates a top schematic view of one side of a transfer mold of FIGS. 2A and 2B, depicting encapsulant shortage in the mold cavities wherein the die assemblies are contained.
Figure 4:
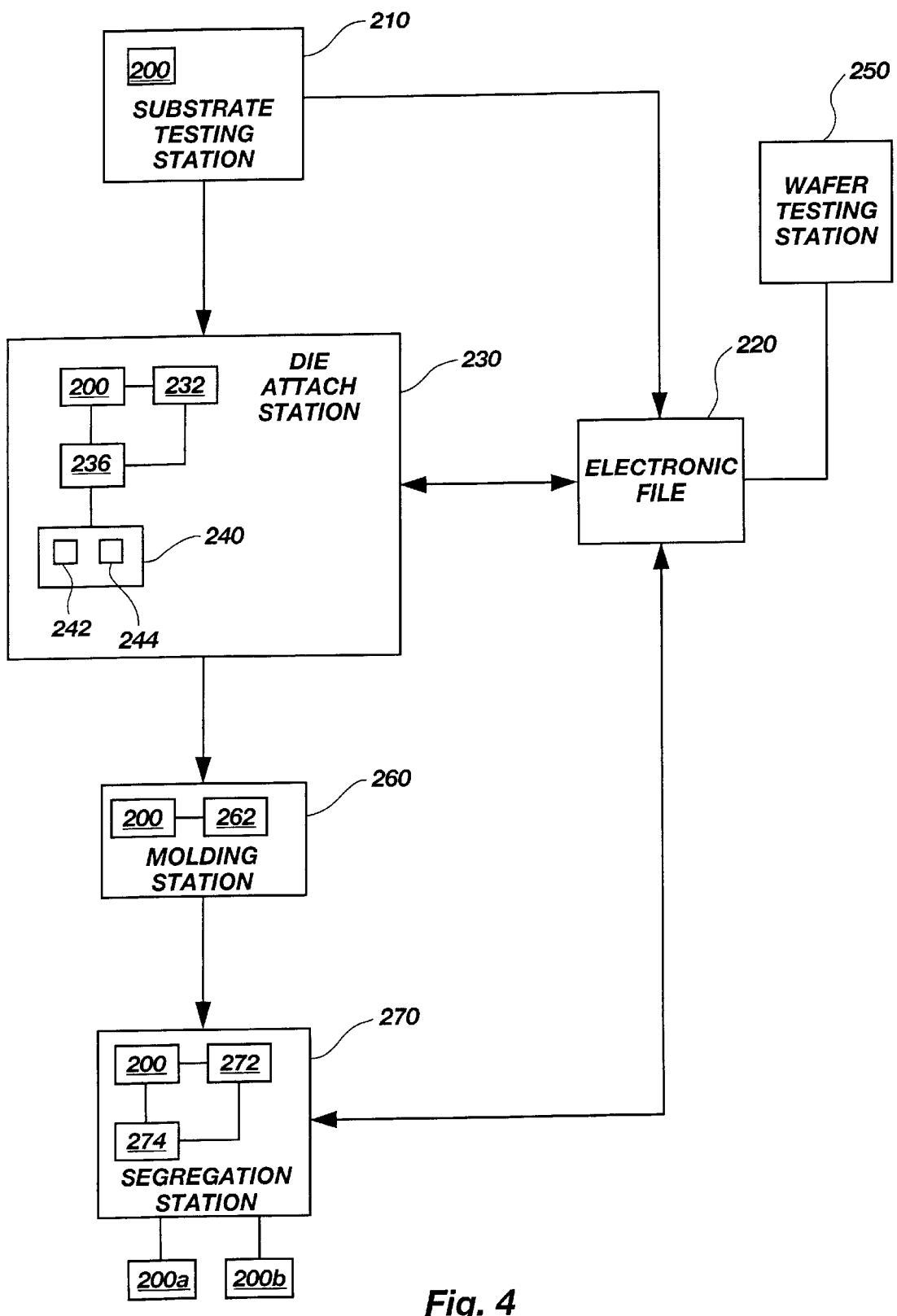
FIG. 4 illustrates a block-diagram of a testing station, mounting station, molding station and segregation station, of which the testing station, mounting station, and segregation station are connected to and operate according to information in an electronic file according to the present invention.

As illustrated in drawing FIG. 4, a block diagram depicts several stations for preparing and fabricating semiconductor die packages from a mounting substrate 200 having a plurality of dice attached thereon. In particular, the block diagram depicts the mounting substrate 200 in various fabrication processes including a substrate testing station 210, a die attach station 230, a molding station 260 and a segregation station 270. Information regarding the mounting substrate 200 and/or the dice attached thereon is uploadable and downloadable to and from an electronic file 220 with respect to the processes undergone in the substrate testing station 210, the die attach station 230, and the segregation station 270. The mounting substrate 200 may be any suitable type mounting substrate having one over more semiconductor die mounted thereon or may be any suitable type lead frame having one or more semiconductor die mounted thereon. Also, the electrical interconnection between circuits of the substrate or leads of the lead frame may be of any suitable type, such as wire bonds, flip-chip type, etc.

Figure 5:
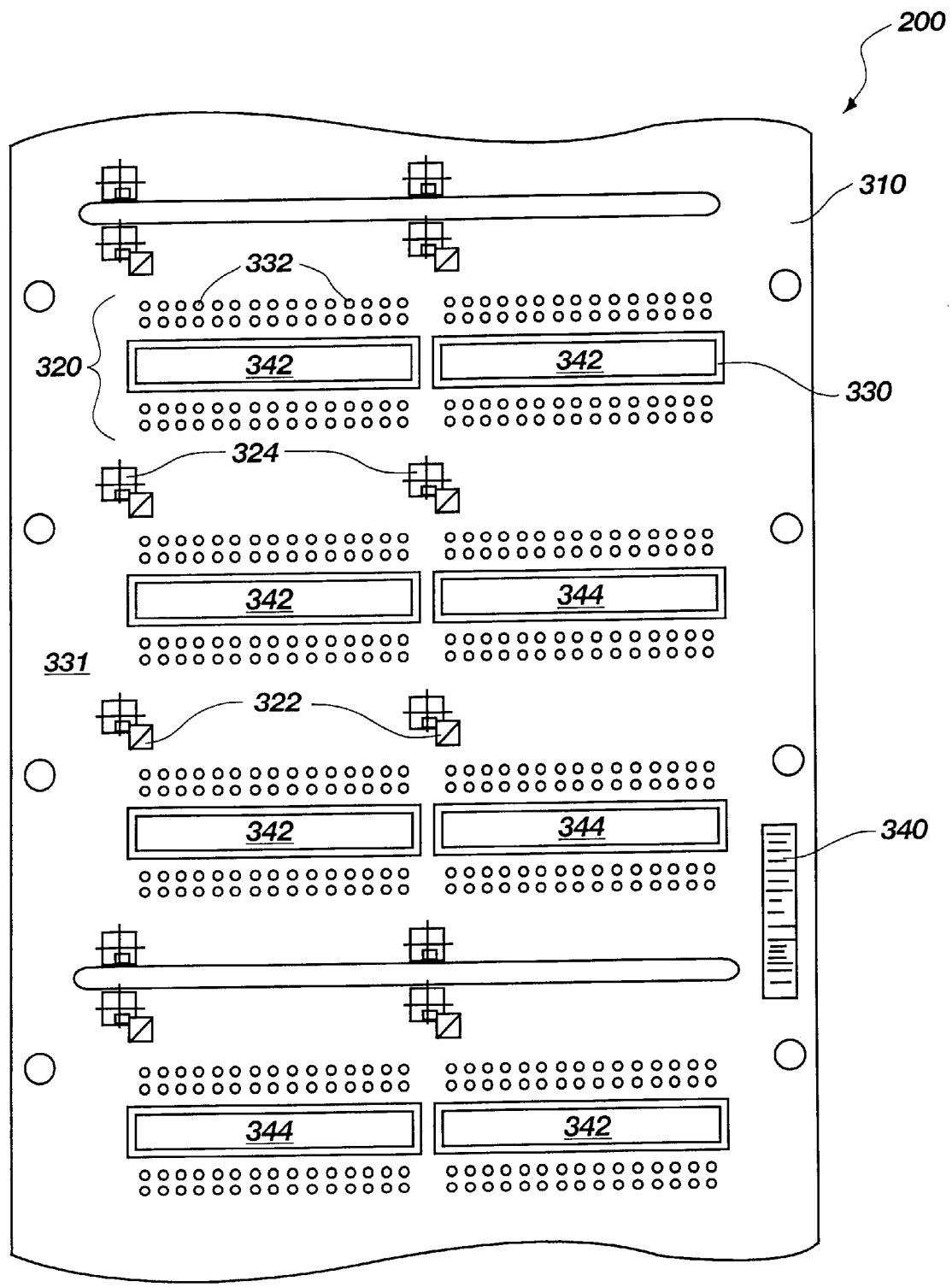
FIG. 5 illustrates a top view of a BGA-type carrier substrate configured with a designator and multiple die sites with good dice and defective dice attached thereto according to the present invention.

Depicted in drawing FIG. 5 is the mounting substrate 200 in the block diagram of drawing FIG. 4. The mounting substrate 200 includes a substrate body 310 with a layer of solder resist formed on a surface thereof and a plurality of semiconductor die sites 320 in an array or matrix. Each semiconductor die site 320 includes a die receiving area 330 with electrical conductors interconnected thereto for semiconductor dice 342,344. The substrate body 310 may, for example, be a multilayer printed wiring board or carrier substrate. Formed as components of each semiconductor die site 320 are various electrical conductors, including bond pads (not shown), circuit traces (not shown), and solder ball contact pads 332, and a die receiving area 330. Other contact pads are provided on the substrate body 310 for interconnection to a mounted integrated circuit die by wire bonding or other means. Conductive (circuit) traces (not shown) underlie the layer of solder resist and extend from the other contact pads to solder ball contact pads 332, upon which solder balls (not shown) may be subsequently formed. As shown, solder ball contact pads 332 are configured in a preselected array pattern surrounding each of semiconductor die sites 320. After die attach, solder ball contact pads 332 with solder balls disposed thereon will comprise connective elements forming a ball grid array around each semiconductor die site 320 for external communication with a printed wiring board, carrier substrate, other BGA package, module board, etc. The solder resist layer 331, which is typically an insulation film formed of an insulation resin, is disposed on substrate body 310 to prevent electrical shorting of conductive traces underlying the resist, as well as to provide protection from contaminants and aid vision systems of automated die attach apparatus in determining the correct mounting orientation for the placement of semiconductor dice on semiconductor die sites 320. Pin one indicators 322 and/or fiducial marks 324 may also be provided. On an otherwise unused peripheral surface area portion of substrate body 310, a designator 340 for encoding various identification information (discussed further below) relating to mounting substrate 200 is illustrated.

As referred to herein, the term "semiconductor die site" includes a portion of a substrate configured for receiving a semiconductor die as well as any electrical conductors associated with the substrate portion. Most generally, the term "semiconductor die site" refers to all components and regions of a substrate which will comprise an integral part of an individual semiconductor die package once a semiconductor die has been associated therewith. As such, the components making up a "semiconductor die site" may be provided on one or both opposing surfaces of a substrate. In certain applications, the term "semiconductor die site" may further include external interconnection components, such as solder balls disposed on a conductor, found in individual semiconductor device packages.

As used herein, the phrase "an otherwise unused peripheral surface area portion" of a substrate or substrate array refers to a substrate region which takes up no real estate or space within an individual semiconductor device package once singulated or separated or otherwise separated from a mounting substrate or mounting substrate array. Thus, a general use of the phrase "an otherwise unused peripheral surface area portion" refers to substrate surface areas which are "off-site" (outside of each of the semiconductor die site areas). Preferably, the phrase "an otherwise unused peripheral surface area portion" of a substrate also refers to substrate areas which are outwardly located from areas of a substrate used for clamping during an encapsulation mold process. Designator 340 is preferably sized to have all portions thereof remain within the otherwise unused peripheral surface area portion, as defined above. A designator 340 placed on an otherwise unused peripheral surface area portion of a substrate thus advantageously takes up no space or real estate within an individual semiconductor device package and preferably creates no openings in the solder resist.

It is understood that although the exemplary mounting substrate 200 is presented as comprising a printed wiring board with multiple semiconductor die sites and more than one ball grid array for external interconnection capability of individual packages, the particular mounting substrate array shown is for illustrative purposes only. Further, one of skill in the art will recognize that the methods of the present invention are applicable to any type of prior art mounting substrate or mounting substrate array which includes one or more semiconductor die site areas to which semiconductor dice are to be mounted and electrically connected. As one example, a mounting substrate 200 may comprise a length of lead frames, the length of lead frames configured with an array, each lead frame having a semiconductor die attach paddle and a plurality of leads for interconnection with a semiconductor die.

Figure 6:
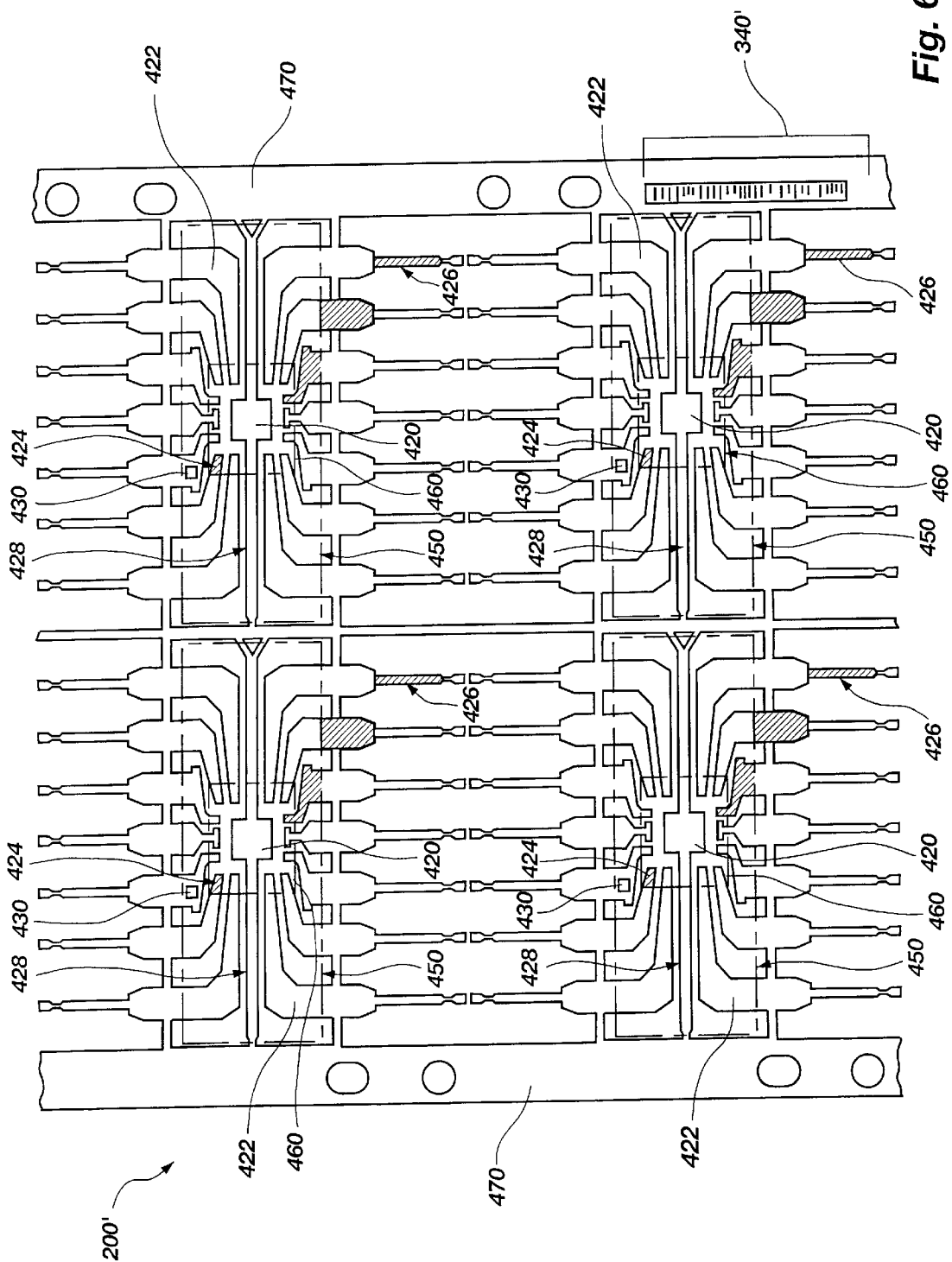
FIG. 6 illustrates a top view of a typical lead frame array with multiple die attach sites configured with a designator according to the present invention.

As can be seen by drawing FIG. 6, lead frames may be manufactured as lead frame arrays 200', the lead frame arrays 200' having dimensions wide enough to accommodate a various number of semiconductor dice across a lead frame width. As illustrated in drawing FIG. 6, an exemplary lead frame array 200' is provided with a designator 340' located thereon. Lead frame array 200' includes an array of semiconductor die supporting pads (die paddles) 420, and a plurality of lead fingers 422 surrounding each die paddle 420. Each lead finger 422 has, in turn, a terminal bonding portion 424 near the die paddle 420 on which the semiconductor die is to be located and an external lead 426 for connection to external circuitry on a circuit board (not shown). Tie bars 428 are provided for support of die paddle 420, and a pair of parallel side rails 470 support tie bars 428. Lead frame array 200' may also include a pin one indicator 430 used for orientation by the vision system of automated die attach apparatus when mounting a semiconductor die to the die paddle 420. Functionally, the lead frame array 200' can be divided into a package area 450, which includes a semiconductor die bonding area 460 therein as well as portions of lead fingers 422. The semiconductor bonding area 460 includes die paddle 420 and the free end of the terminal bonding portions 424 of lead fingers 422. In this arrangement, designator 340' is located in an otherwise unused peripheral surface area portion of lead frame array 200'. As one example, designator 340' may be located on, or in close proximity to, a frame portion of lead frame array 200', such as an unused portion of side rails 470.

Referring again to drawing FIG. 4, the mounting substrate 200 previously discussed with respect to drawing FIG. 5 is tested in the substrate testing station 210. The designator 340 may be applied prior to entering the substrate testing station or while at such substrate testing station 210. Variations of designator 340 are disclosed in application Ser. No. 09/650, 796, also assigned to Micron Technology, Inc., which discloses a method and apparatus for marking and identifying a defective die site utilizing a designator within the contemplated scope of the designator 340 of the present invention, the disclosure of which is incorporated herein by this reference.

At the substrate testing station 210, each individual semiconductor die site 320 of mounting substrate 200 is tested and characterized for electrical and structural integrity by methods known in the art. For example, vision systems, such as PRS, can be used to examine structural defects such as broken leads, dendrite growth, solder resist irregularities, oxide contamination, corrosion, etc. In this step, the vision system will typically compare pictures of lead frame fingers, bond pads, and other features on and around the individual semiconductor die sites 320 to a predetermined known good template. Electrical testing can also be accomplished, for example, by use of various automated or other test equipment, including curve tracer testing, test probes, RF testing, and the like. Tests screening for intermittent failures, such as high-temperature reverse-bias (HTRB) testing, vibration testing, temperature cycling, and mechanical shock testing, etc., are also contemplated by the present invention, as well as tests for solderability, micro-corrosion, noise characterization, electromigration stress, electrostatic discharge, plating defects, etc. The results of the various tests are fed into a computer, compiled, and correlated for each of the individual semiconductor die sites 320 on a particular mounting substrate 200. Semiconductor die sites 320 which are otherwise free from defects may then be categorized as known good semiconductor die sites and semiconductor die sites that are determined to be defective are categorized as known defective die sites.

The test results for each mounting substrate are then provided as mapped information to an electronic file 220 in a database at a remote location. Such electronic file 220 correlates with a particular designator 340 and its corresponding identifier with respect to the particular mounting substrate 200. Alternatively, the mapped information may be encoded in the designator 340 itself. Preferably, the designator 340 includes identification information as to the particular mounting substrate 200 in order to access the electronic file 220 having the mapped information therein. The designator 340 may be in the form of a bar code, marking, or other label, to be inscribed or placed on an unused peripheral surface area portion of the mounting substrate 200. Designator 340 thus provides identification access to the electronic file which contains computer readable information regarding the performance characteristics of one or more, or all of the individual semiconductor die sites for its respective particular mounting substrate 200. As used herein, information relating to the "performance characteristics" of a semiconductor die site includes, at the very least, information identifying defective die sites and good die sites on mounting substrate 200.

The correlated and compiled mapped information accessed from the electronic file 220, or alternatively encoded within designator 340, will also preferably contain information such as the history of the semiconductor die and the substrate, the lot number, and other information useful in fault verification and fault isolation analysis. Mapped information may also include instructions for orientating the mounting substrate 200 during various processes, such as die attach and wire bonding. In an aspect of this embodiment, the mapped information may contain information relating to the proper pin one orientation and placement of the pin one of a semiconductor die in relation to the pin one mounting areas of each individual die site on mounting substrate array 200.

As previously described, the computer readable information of designator 340 may preferably be in the form of a bar code symbol comprising a number of printed bars and intervening spaces, the bars and spaces forming patterns of light and dark areas. The bar code is typically read by use of a low-powered laser as a light source and a sensor to detect reflections from the light areas of the bar code. The reflected pattern detected by the sensor converts light energy into electrical energy. The result is an electrical signal that can be converted into data. The data can then be used to reconstruct the bar code image by a decoder (microprocessor), which then compares the reconstructed image with images representing various characters or symbols previously stored in a computer database. Preferably, the bar codes used in the present invention make use of Code 39, allowing for the bar coding of numbers, letters, and some punctuation. The bar codes that may be used in the present invention are without limitation, however, and may include UPC, EAN, Code 93, Code 128, Codabar, MSI, Interleaved 2 of 5, etc. "Interleaved 2 of 5" is particularly desirable for simple encoding in very small regions of mounting substrate 200 because of its highly compact nature.

Preferably, the mapped information correlates with the test and inspection information with respect to individual semiconductor die sites and a particular substrate configuration can be used to create a computerized map of the substrate, the computerized substrate map comprising test and inspection data related to the functionality of each of the semiconductor die sites and stored in computer memory as electronic file 220. Data within the electronic file 220 may then be transferred electronically to and from various fabrication stations, as shown in drawing FIG. 4, for processing the semiconductor packages. As such, the mapped information in electronic file 220 is used in combination with designator 340 having the bar code of the present invention.

In another embodiment, a coded strip of magnetic tape can be placed on and affixed to the mounting substrate 200 to act as the designator 340. Use of a magnetic strip for encoding information relating to the mounting substrate is advantageous in that magnetic strips are capable of encoding large amounts of information, they can be easily attached and removed, and they can be programmed or reprogrammed at various phases of semiconductor processing. As one example, a magnetic strip can be provided on a peripheral region of a mounting substrate after an array of semiconductor die sites and various conductors have been formed thereon. Information preliminarily encoded on the magnetic strip may include manufacturing information, such as various process specifications used in forming the mounting substrate. The magnetic strip may also include testing specifications and parameters, as well as identifying information, such as lot number, and time, date and place of manufacture, etc. After testing and visual inspection of the substrate and its associated semiconductor die sites, the various inspection information, including information concerning the performance of each semiconductor die site, may be added to the magnetic strip. This information can then be read by a magnetic reader and used, for example, in fault verification and fault isolation analysis, and/or the information can be used by a microprocessor to make decisions in later processing steps, such as die attach, wire bonding, encapsulation and singulation. At each stage of processing, the manufacturing, testing, and identifying information as previously set forth can be removed from or added to the magnetic strip on a continuing basis. Information encoded on the magnetic strip may also reflect reconditioning, repairs or other alternative processing steps performed on the substrate.

Preferably, designator 340 provided on the mounting substrate maintains identification information as to the particular mounting substrate 200 the designator is attached to, thus, providing access to the mapped information corresponding to the particular mounting substrate 200 in the electronic file 220. With the designator 340 in place and the mapped information recorded electronically in the electronic file 220, the mounting substrate 200 is then transferred to the die attach station 230 for die attach processing.

At the die attach station 230, there is a reading unit 232 and pick-and-place equipment 236, which is coupled to a semiconductor die bin 240 having both known good dice 242 and known defective dice 244 therein. The reading unit 232 or vision system scans the designator 340 to identify the particular mounting substrate 200 to thereby access the mapped information from the electronic file 220. The mapped information, according to the corresponding identifier scanned from the designator 340, is then downloaded to the pick-and-place equipment 236, allowing such pick-and-place equipment 236 to know precisely the locale of each semiconductor die site 320 and, in particular, which semiconductor die sites 320 are defective and which are good. According to the present invention, the pick-and-place equipment 236 or die attach apparatus then selectively attaches known good dice to the known good die sites and known defective dice to the known defective die sites. The electronic file 220 may then be updated with information as to the known defective die sites having known defective dice and the known good die sites having known good dice attached thereto.

Alternatively, the electronic file 220 may also include wafer mapped information from a wafer testing station 250. Such wafer mapped information may be utilized by the pick-and-place equipment 236 to selectively take known good dice 242 and known defective dice 244 from a precut wafer. In this manner, the wafer mapped information may be downloaded to the pick-and-place equipment 236 to facilitate selectively attaching the corresponding good dice and defective dice to respective good die sites and defective die sites.

After die attach at the die attach station 230, the mounting substrate 200 is prepared for encapsulation at the molding station 260. The molding station 260 preferably includes a transfer molding operation having typical transfer molding equipment with mold cavities as known in the art. If desired, the molding station 260 may include a reading unit 262 for reading the mounting substrate 200 and having access to the electronic file 200 information concerning the substrate and semiconductor dice. Since the defective die sites also include the defective dice attached thereon, the amount of encapsulation material required for injecting into the mold cavities is substantially constant and consistent and, therefore, may be predetermined. Therefore, the quantity of encapsulation material may be minimized to the amounts necessary for filling the mold cavities and thereby fully encapsulating the dice therein. Knowing the necessary amounts for the transfer molding process results in advantages in cost and yield of the product by preventing the waste and shortage of encapsulation material.

After the transfer molding operation at the molding station 260, the mounting substrate 200 comprises multiple semiconductor die packages with the attached and encapsulated dice thereon. As such, the mounting substrate is transferred to the segregation station 270 to be segregated. The segregation station 270 preferably includes a reading unit 272 and a segregation unit 274. The reading unit 272 reads the encoded information on the designator 340 to thereby access the mapped information from the electronic file 220. The mapped information is then used at the segregation station 270 to know which die attach sites with dice attached thereto are defective and which are good. The mounting substrate 200, with the multiple encapsulated dice attached thereon, is then segregated to form individual semiconductor die packages comprising good die packages 200a and defective die packages 200b. Such individual packages are then sorted between the defective packaged dice and the good packaged dice via the mapped information downloaded from the electronic file 220, wherein information regarding the sorting of the good die packages and the defective die packages may be updated to the electronic file 220. The defective die packages 200b are then discarded while the good die packages 200a proceed for further testing and/or processing.

The use of designator 340 provides numerous advantages as compared to prior art methods of identifying defective semiconductor die sites by manually inking-out one or more features. First, the present invention advantageously takes up no real estate on a semiconductor die site. As the industry demand for smaller packages continues to escalate, the space available for unique features (such as pin one indicators) becomes increasingly smaller. Thus, the present invention anticipates the industry's future needs and is particularly advantageous when used in combination with substrate arrays for producing chip scale, or near chip scale, packages. Second, the invention requires no openings in the solder resist of an individual semiconductor device package, thus allowing for a more planar solder resist surface for clamping to reduce resin bleed during a mold encapsulation process. Third, the present invention avoids the problems inherent in "inking-out" the very small, unique features on die sites, including problems associated with operator error and ink contamination due to ink bleeding, smearing, or spraying. Additionally, the present invention provides for a completely automated process of identifying and recording multiple defective semiconductor die sites on a substrate, thus allowing throughput to be increased substantially. Finally, information relating to the processing, design specifications, and other history of a mounting substrate array can be included in the information encoded by designator 340, thus substantially advancing the practice of fault isolation and verification.

It will be appreciated by those skilled in the art that the embodiments herein described, while illustrating certain embodiments, are not intended to so limit the invention or the scope of the appended claims. Those skilled in the art will also understand that various combinations or modifications of the preferred embodiments could be made without departing from the scope of the invention.

What is claimed is:

1. A method for assembling at least one semiconductor die to a substrate comprising:

providing a mounting substrate having a plurality of die attach sites on a surface thereof;

evaluating said plurality of die attach sites on said mounting substrate to produce mapped information of good die attach sites and defective die attach sites;

providing said mapped information to an electronic file; and attaching at least one semiconductor die to said mounting substrate according to said mapped information by one of attaching a known good die to a good die attach site of said good die attach sites and attaching a known defective die to a defective die attach site of said defective die attach sites.

2. The method of claim 1, wherein said evaluating comprises testing at least one die attach site of said plurality of die attach sites on said mounting substrate.

3. The method of claim 1, further comprising providing a designator having substrate identification information on a peripheral portion of said mounting substrate.

4. The method of claim 3, further comprising providing a reading unit for reading said designator to access said mapped information in said electronic file with respect to said mounting substrate corresponding to said substrate identification information.

5. A method for fabricating semiconductor packages, the method comprising:

providing a mounting substrate having a plurality of die attach sites on at least one surface thereof;

evaluating said plurality of die attach sites on said mounting substrate to provide mapped information of good die attach sites and defective die attach sites;

attaching at least one semiconductor die to said mounting substrate according to said mapped information by one of attaching a known good die to a good die attach site of said good die attach sites and attaching a known defective die to a defective die attach site of said defective die attach sites; and encapsulating said mounting substrate using an encapsulation material.

6. The method of claim 5, wherein said evaluating comprises testing each of said plurality of die attach sites on said mounting substrate.

7. The method of claim 5, further comprising providing said mapped information to an electronic file.

8. The method of claim 7, further comprising providing a designator having substrate identification information on a peripheral portion of said mounting substrate.

9. The method of claim 8, further comprising reading said designator with a reading unit to access said mapped information in said electronic file with respect to said mounting substrate corresponding to said substrate identification information.

10. The method of claim 5, further comprising segregating said at least one semiconductor die attached to said mounting substrate into a semiconductor die package.

11. The method of claim 10, wherein said segregating comprises separating from said semiconductor package at least one semiconductor die package having one of said known good die attached to said good die attach site and said known defective die attached to said defective die attach site according to said mapped information.

12. The method of claim 5, wherein said encapsulating comprises transfer molding said mounting substrate.

* * * * *

UNITED STATES PATENT AND TRADEMARK OFFICE
CERTIFICATE OF CORRECTION

PATENT NO. : 6,555,400 B2
DATED : April 29, 2003
INVENTOR(S) : Warren M. Farnworth and Derek J. Gochnour It is certified that error appears in the above-identified patent and that said Letters Patent is hereby corrected as shown below:

Column 1,
Line 39, change "die" to -- dice --
Line 41, change "photo-lithographic" to -- photolithographic --

Column 2,
Line 20, change "with solder balls 32" to -- and --
Line 27, after "proximite" insert -- to --
Lines 35 and 39, change "photo-lithographic" to -- photolithographic --
Line 40, delete the comma after "10"

Column 6,
Line 24, after "dice" delete "50"
Line 57, change "board type" to -- board-type -- and after "any" delete "type"
Line 58, change "frame type" to -- frame-type --.

Column 7,
Line 2, delete the comma after "which"

Column 8,
Line 45, change "block-diagram" to -- block diagram --

Column 9,
Line 7, change "over" to -- or --

Column 10,
Line 43, delete the comma after "420"

Column 11,
Line 48, delete the comma after "label"
Line 53, delete the comma after "more"

Column 12,
Line 5, before "200" delete "array"

UNITED STATES PATENT AND TRADEMARK OFFICE
CERTIFICATE OF CORRECTION

PATENT NO. : 6,555,400 B2
DATED : April 29, 2003
INVENTOR(S) : Warren M. Farnworth and Derek J. Gochnour It is certified that error appears in the above-identified patent and that said Letters Patent is hereby corrected as shown below:

Column 13,
Line 54, change "200" to -- 220 --

Column 14,
Line 18, after "packages" and before "and" insert -- 200a --
Line 19, after "packages" and before "and" insert -- 200b --

Signed and Sealed this

Twenty-seventh Day of April, 2004

JON W. DUDAS
*Acting Director of the United States Patent and Trademark Office*